(12) United States Patent
Alpert et al.

(10) Patent No.: US 9,524,363 B2
(45) Date of Patent: Dec. 20, 2016

(54) ELEMENT PLACEMENT IN CIRCUIT DESIGN BASED ON PREFERRED LOCATION

(75) Inventors: Charles J. Alpert, Austin, TX (US); Gi-Joon Nam, Austin, TX (US); Chin Ngai Sze, Austin, TX (US); Paul G. Villarrubia, Austin, TX (US); Natarajan Viswanathan, Austin, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 518 days.

(21) Appl. No.: 13/485,828

(22) Filed: May 31, 2012

(65) Prior Publication Data

US 2013/0326455 A1     Dec. 5, 2013

(51) Int. Cl.
*G06F 17/50* (2006.01)

(52) U.S. Cl.
CPC ....... *G06F 17/5072* (2013.01); *G06F 17/5081* (2013.01); *G06F 17/5068* (2013.01)

(58) Field of Classification Search
CPC .............. G06F 17/5068; G06F 17/5072; G06F 17/5081
USPC ................. 716/100, 118–119, 122, 132–135
See application file for complete search history.

(56) References Cited

U.S. PATENT DOCUMENTS

| | | | |
|---|---|---|---|
| 5,737,233 A * | 4/1998 | Rao ............................. | 716/119 |
| 5,838,583 A | 11/1998 | Varadarajan et al. ........ | 716/123 |
| 6,058,252 A | 5/2000 | Noll et al. ................... | 716/113 |
| 6,088,519 A * | 7/2000 | Koford ......................... | 716/123 |
| 6,487,708 B1 | 11/2002 | Canaris ........................ | 716/121 |
| 7,020,861 B2 | 3/2006 | Alpert et al. ................. | 716/113 |
| 7,073,144 B2 * | 7/2006 | Alpert et al. ................. | 716/111 |
| 7,082,595 B1 | 7/2006 | Chan et al. ................... | 716/119 |
| 7,590,960 B1 | 9/2009 | Kong et al. ................... | 716/124 |
| 7,917,881 B1 * | 3/2011 | Chen et al. ................... | 716/134 |
| 7,984,410 B2 * | 7/2011 | Chen et al. ................... | 716/119 |
| 8,010,923 B1 | 8/2011 | Srinivasan et al. ........... | 716/116 |
| 8,028,265 B2 | 9/2011 | Ramsour et al. ............. | 716/122 |
| 8,028,266 B2 | 9/2011 | Ramsour et al. ............. | 716/122 |
| 8,370,784 B2 * | 2/2013 | Padmanabhan et al. ..... | 716/132 |
| 8,453,093 B2 * | 5/2013 | Kim et al. .................... | 716/122 |
| 2001/0003843 A1 * | 6/2001 | Scepanovic et al. ............ | 716/7 |
| 2004/0199884 A1 * | 10/2004 | Brittain et al. ................... | 716/4 |
| 2004/0230931 A1 * | 11/2004 | Barbee et al. ................... | 716/10 |
| 2005/0235237 A1 * | 10/2005 | Alpert et al. ..................... | 716/8 |
| 2006/0253820 A1 * | 11/2006 | Bzowy ............................. | 716/6 |

(Continued)

OTHER PUBLICATIONS

SparkNotes, "SparkNotes: SAT Physics: Newton's Laws of Universal Gravitation", 2011. Sparknotes—obtained on Nov. 5, 2013 at http://www.sparknotes.com/testprep/books/sat2/physics/chapter1/section2.rhtml. pp. 1-4.*

(Continued)

*Primary Examiner* — Stacy Whitmore
(74) *Attorney, Agent, or Firm* — Heslin Rothenberg Farley & Mesiti P.C.; George S. Blasiak

(57) ABSTRACT

An improved circuit design system may include a computer processor to perform a placement for a circuit by physical synthesis. The system may also include a controller to compute a preferred location of at least one selected element of the circuit, and to calculate placement constraints for each selected element. The system may further include an updated design for the circuit generated by performing another round of physical synthesis with the placement constraints.

19 Claims, 8 Drawing Sheets

(56) References Cited

U.S. PATENT DOCUMENTS

| | | | |
|---|---|---|---|
| 2009/0031277 A1* | 1/2009 | McElvain et al. | 716/18 |
| 2009/0031278 A1* | 1/2009 | McElvain et al. | 716/18 |
| 2010/0023913 A1* | 1/2010 | Cohn et al. | 716/13 |
| 2010/0257499 A1* | 10/2010 | Alpert et al. | 716/6 |
| 2011/0107286 A1* | 5/2011 | Batterywala et al. | 716/122 |
| 2012/0096417 A1* | 4/2012 | Durbha et al. | 716/103 |
| 2012/0266124 A1* | 10/2012 | Alpert et al. | 716/122 |
| 2013/0097573 A1* | 4/2013 | Kim et al. | 716/123 |

OTHER PUBLICATIONS

Shantanu Dutt et al., "A Network-Flow Approach to Timing-Driven Incremental Placement for ASICs" ICCAD'06 Nov. 5-9, 2006.

Louise Trevillyan et al., "An Integrated Environment for Technology Closure of Deep-Submicron IC Designs" 0740-7475/04 © 2004 IEEE.

Saurabh N. Adya et al., "On Whitespace and Stability in MixedSize Placement and Physical Synthesis" ICCAD '03 San Jose.

Zhuo Li et al., "What is Physical Synthesis?" ACM/SIGDA E-Newsletter vol. 41, No. 1, pp. 1-3 (Jan. 2011).

* cited by examiner

ELEMENT PLACEMENT IN CIRCUIT DESIGN BASED ON PREFERRED LOCATION

BACKGROUND

The disclosure relates to the field of computer systems, and, more particularly, to a computer system for improving circuit designs.

During the very-large-scale integration ("VLSI") design flows, physical synthesis tools (in particular, placement, timing optimization, routing and/or the like) may be invoked iteratively while circuit designers make changes to floorplans, timing assertions, logic implementations, etc. The synthesis result may be back annotated for decision making of further design changes.

SUMMARY

According to one embodiment, an improved circuit design system may include a computer processor to perform a placement for a circuit by physical synthesis. The system may also include a controller to compute a preferred location of at least one selected element of the circuit, and to calculate placement constraints for each selected element. The system may further include an updated design for the circuit generated by performing another round of physical synthesis with the placement constraints.

The system may additionally include a converger to detect a threshold of desirable characteristics based upon performing additional rounds of physical synthesis with updated placement constraints until a convergence emerges based upon the timing, power, area, and/or operating temperature of the design. An example of convergence is that the design meets the timing requirement/constraints after iteration of physical synthesis. This is referred to as timing convergence. Same concept can be applied to power, area, operating temperature of the design. The system may also include a locator to compute the preferred location based upon keeping a previous location as the preferred location, spreading the selected elements and taking it as the preferred locations, and/or positioning previous locations of gates and/or latches relative to the primary input and/or primary output according to asserted changes.

The spreading may be based upon the area of added logic and/or diffusion. The asserted changes may be based upon timing, congestion, and/or design rules.

The system may further include portions of the circuit with each portion having an input pin and an output pin. The system may additionally include an adjustor to adjust the preferred location according to the placement results based upon checking routing congestion and timing problems and updating the preferred location and the constraints, and/or adjusting the constraints according to a distance from an original preferred location to the placement.

Another aspect is a method for improving a circuit design system. The method may include performing a placement for a circuit by physical synthesis using a computer processor. The method may also include computing a preferred location of at least one selected element of the circuit. The method may further include calculating placement constraints for each selected element. The method may additionally include performing another round of physical synthesis with the placement constraints to generate an updated design for the circuit.

The method may also include performing additional rounds of physical synthesis with updated placement constraints until a convergence of desirable characteristics emerges based upon the timing, power, area, and/or operating temperature of the design. The method may further include computing the preferred location based upon keeping a previous location as the preferred location, spreading the selected elements and taking it as the preferred locations, and/or positioning previous locations of gates and/or latches relative to the primary input and/or primary output according to asserted changes.

The spreading may be based upon the area of added logic and/or diffusion. The asserted changes may be based upon timing, congestion, and/or design rules.

The method may also include dividing the circuit into portions modules with each portion module having a set of input pins and a set of output pins. The method may further include adjusting the preferred location according to the placement results based upon checking routing congestion and timing problems and updating the preferred location and the constraints, and/or adjusting the constraints according to a distance from an original preferred location to the placement. Further, if the distance is large an attraction force is reduced.

Another aspect is computer readable program codes coupled to tangible media to improve a circuit design system. The computer readable program codes may be configured to cause the program to perform a placement for a circuit by physical synthesis using a computer processor. The computer readable program codes may also compute a preferred location of at least one selected element of the circuit. The computer readable program codes may further calculate placement constraints for each selected element. The computer readable program codes may additionally perform another round of physical synthesis with the placement constraints to generate an updated design for the circuit.

The computer readable program codes may also perform additional rounds of physical synthesis with updated placement constraints until a convergence of desirable characteristics emerges based upon the timing, power, area, and/or operating temperature of the design. The computer readable program codes may further compute the preferred location based upon at least one of keeping a previous location as the preferred location, spread the selected elements and take it as the preferred locations, and position previous locations of gates and/or latches relative to the primary input and/or primary output according to asserted changes.

The computer readable program codes may additionally divide the circuit into portions with each portion having an input pin and an output pin. The computer readable program codes may also adjust the preferred location according to the placement results based upon checking routing congestion and timing problems and updating the preferred location and the constraints, and/or adjust the constraints according to a distance from an original preferred location to the placement.

DETAILED DESCRIPTION OF THE INVENTION

The invention will now be described more fully hereinafter with reference to the accompanying drawings, in which preferred embodiments of the invention are shown. Like numbers refer to like elements throughout.

Figure 1:
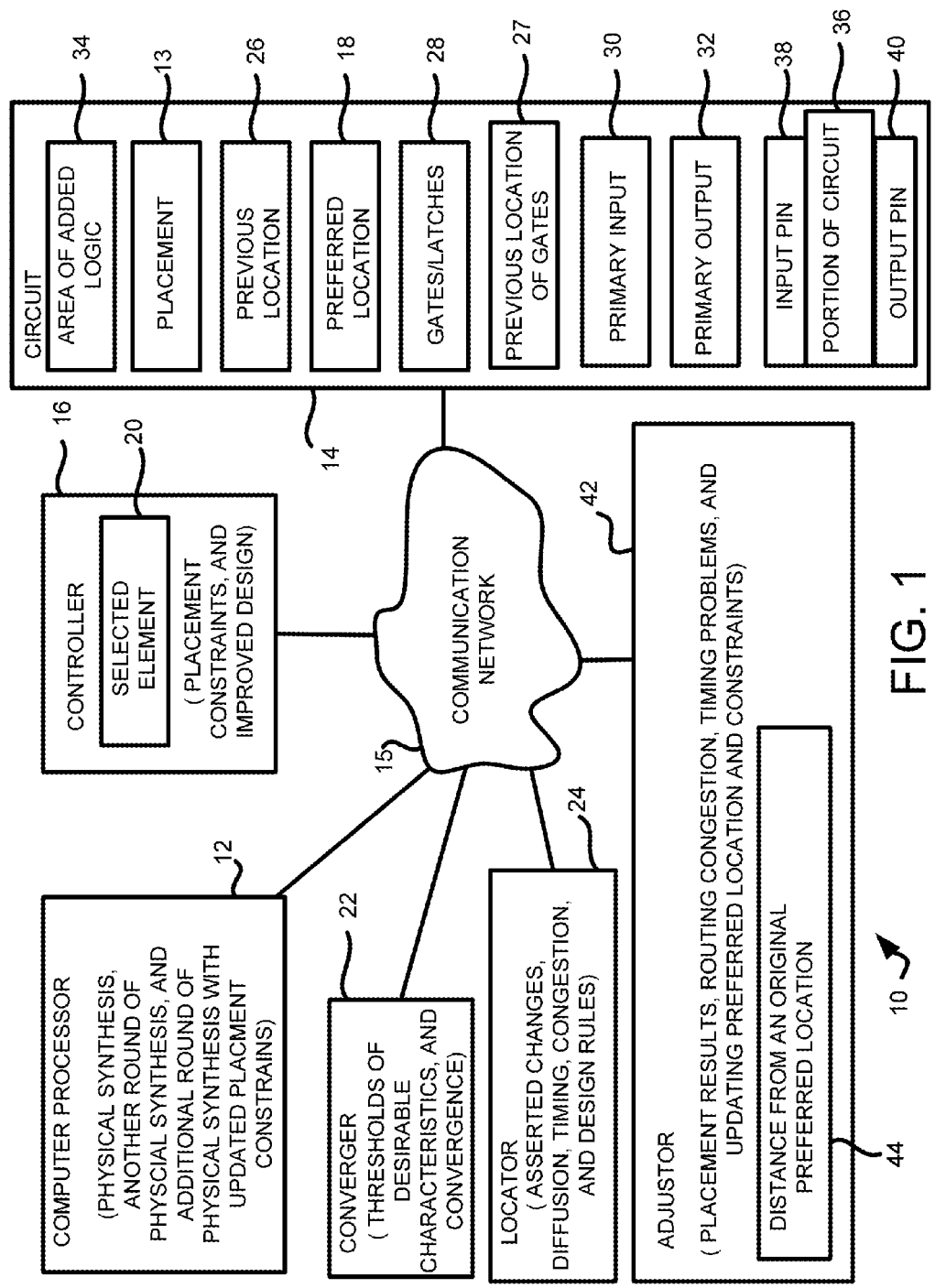
FIG. 1 is a block diagram illustrating an improved circuit design system in accordance with various embodiments.

With reference now to FIG. 1, an improved circuit design system 10 is initially described. In an embodiment, the system 10 includes a computer processor 12 to perform a placement 13 for a circuit 14 by physical synthesis. Physical synthesis and placement using physical synthesis is well-known to those of skill in the art.

The system 10 also includes a controller 16 to compute a preferred location 18 of at least one selected element 20 of the circuit 14, and to calculate the placement 13 constraints for each selected element. The selected element 20 comprises discrete components, interconnects, integrated circuits, blocks, and/or the like.

The system 10 further includes an updated design for the circuit 14 generated by performing another round of physical synthesis with the placement 13 constraints. Stated another way, system 10 provides a new and useful output so that a physical manifestation of the improved design can be realized.

In one embodiment, the system 10 additionally includes a converger 22 to detect a threshold of desirable characteristics based upon performing additional rounds of physical synthesis with updated placement 13 constraints until a convergence emerges. In other words, system 10 helps to improve the convergence based upon the timing, power, area, and/or operating temperature of the design. In another embodiment, the system 10 also includes a locator 24 to compute the preferred location 18 based upon keeping a previous location 26 as the preferred location. In another embodiment, the system 10 also includes a locator 24 to compute the preferred location 18 based upon spreading the selected elements 20 and taking it as the preferred locations 26. In another embodiment, the system 10 also includes a locator 24 to compute the preferred location 18 based upon positioning previous locations 26 of gates/latches 28 relative to the primary input 30 and/or primary output 32 according to asserted changes.

In one embodiment, the spreading is based upon the area of added logic 34 and/or diffusion spreading. In another embodiment, the asserted changes are based upon timing, congestion, and/or design rules. In another embodiment, the asserted changes comprise user controllable thresholds and/or parameters.

In one embodiment, the system 10 further includes portions 36 of the circuit 14 with each portion having an input pin 38 and an output pin 40. In another embodiment, the system 10 additionally includes an adjustor 42 to adjust the preferred location 18 according to the placement 13 results based upon analyzing routing congestion and/or timing problems and updating the preferred location and/or the constraints. In another embodiment, the system 10 additionally includes an adjustor 42 to adjust the preferred location 18 according to the placement 13 results based upon adjusting the constraints according to a distance from an original preferred location 44 to the placement.

In one embodiment, the system 10 includes a communications network 15, which enables a signal to travel anywhere within system 10 and/or to any other system connected to system 10. The communications network 15 is wired and/or wireless, for example. The communications network 15 is local and/or global with respect to system 10, for instance.

Figure 2:
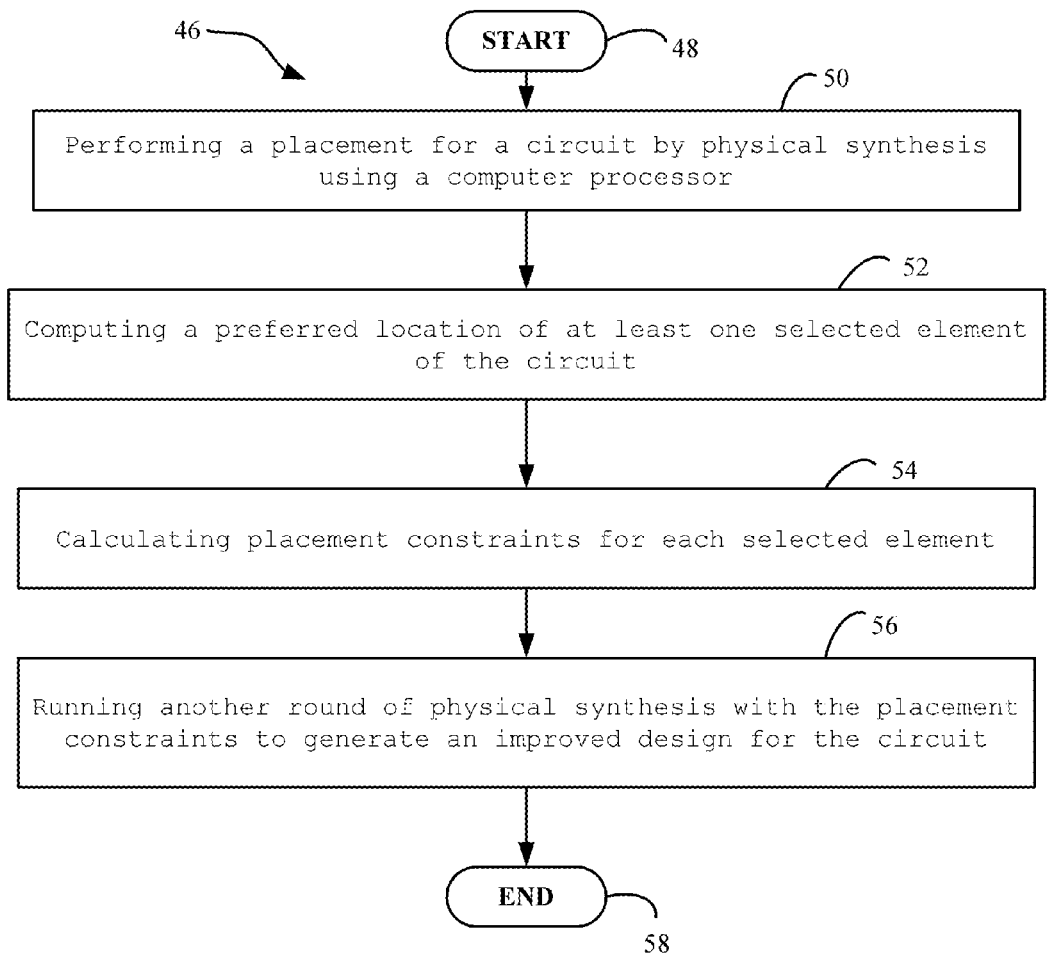
FIG. 2 is a flowchart illustrating method aspects according to various embodiments.

Another aspect is a method for improving the circuit design system 10, which is now described with reference to flowchart 46 of FIG. 2. The method begins at Block 48 and may include performing a placement for a circuit by physical synthesis using a computer processor at Block 50. In one embodiment, the physical synthesis includes placement, optimization and routing. The method may also include computing a preferred location of at least one selected element of the circuit at Block 52. The method may further include calculating placement constraints for each selected element at Block 54. The method may additionally include performing another round of physical synthesis with the placement constraints to generate an updated design for the circuit at Block 56. In one embodiment, system 10 runs another round of placement with placement constraints and then it generates updated placement constraints for the circuit. It will be faster because placement is usually much faster than a full physical synthesis run. The method ends at Block 58.

Figure 3:
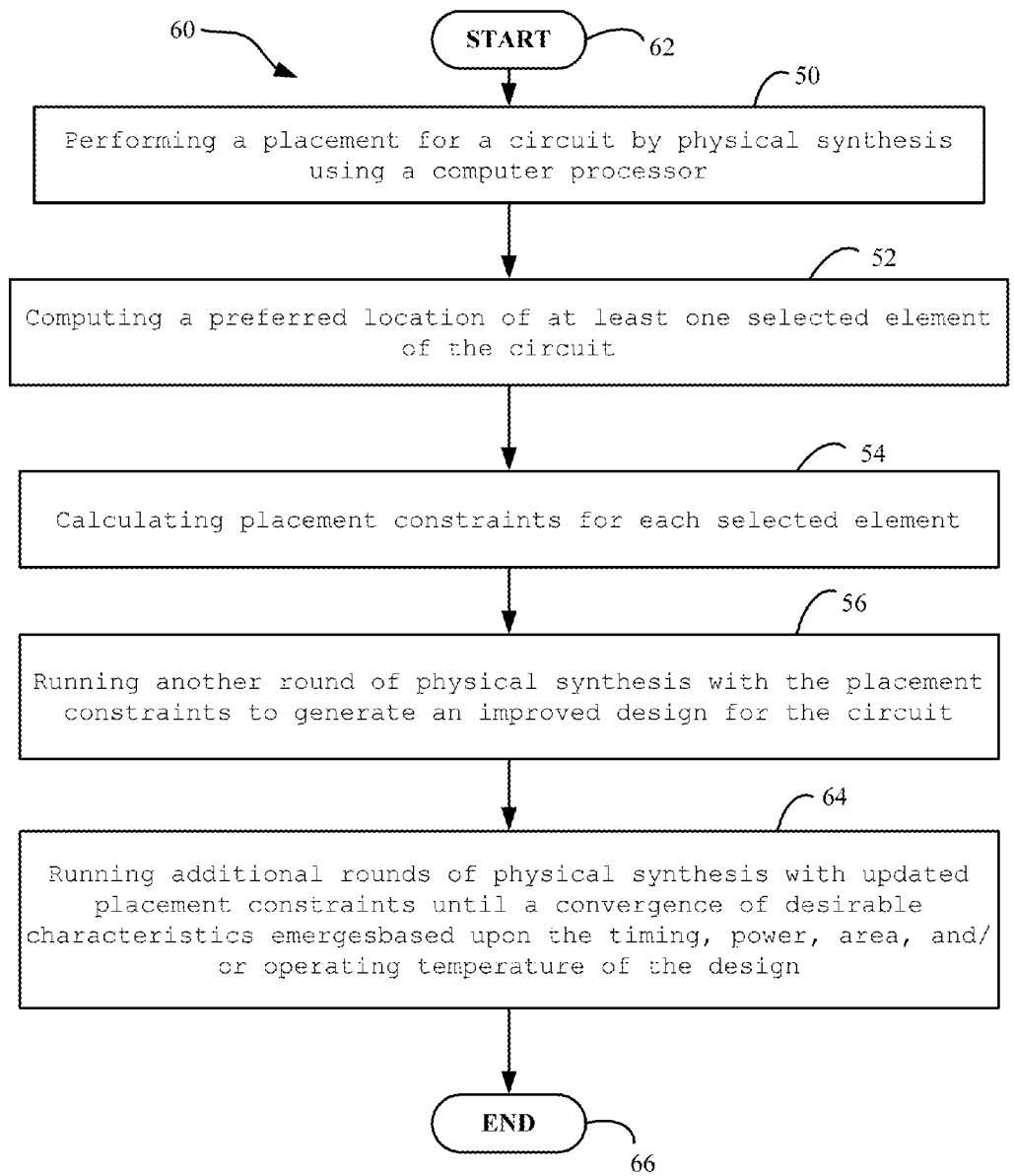
FIG. 3 is a flowchart illustrating method aspects according to the method of FIG. 2.

In another method embodiment, which is now described with reference to flowchart 60 of FIG. 3, the method begins at Block 62. The method may include the steps of FIG. 2 at Blocks 50, 52, 54, and 56. The method may also include performing additional rounds of physical synthesis with updated placement constraints until a convergence of desirable characteristics emerges based upon the timing, power, area, and/or operating temperature of the design at Block 64. The method ends at Block 66.

Figure 4:
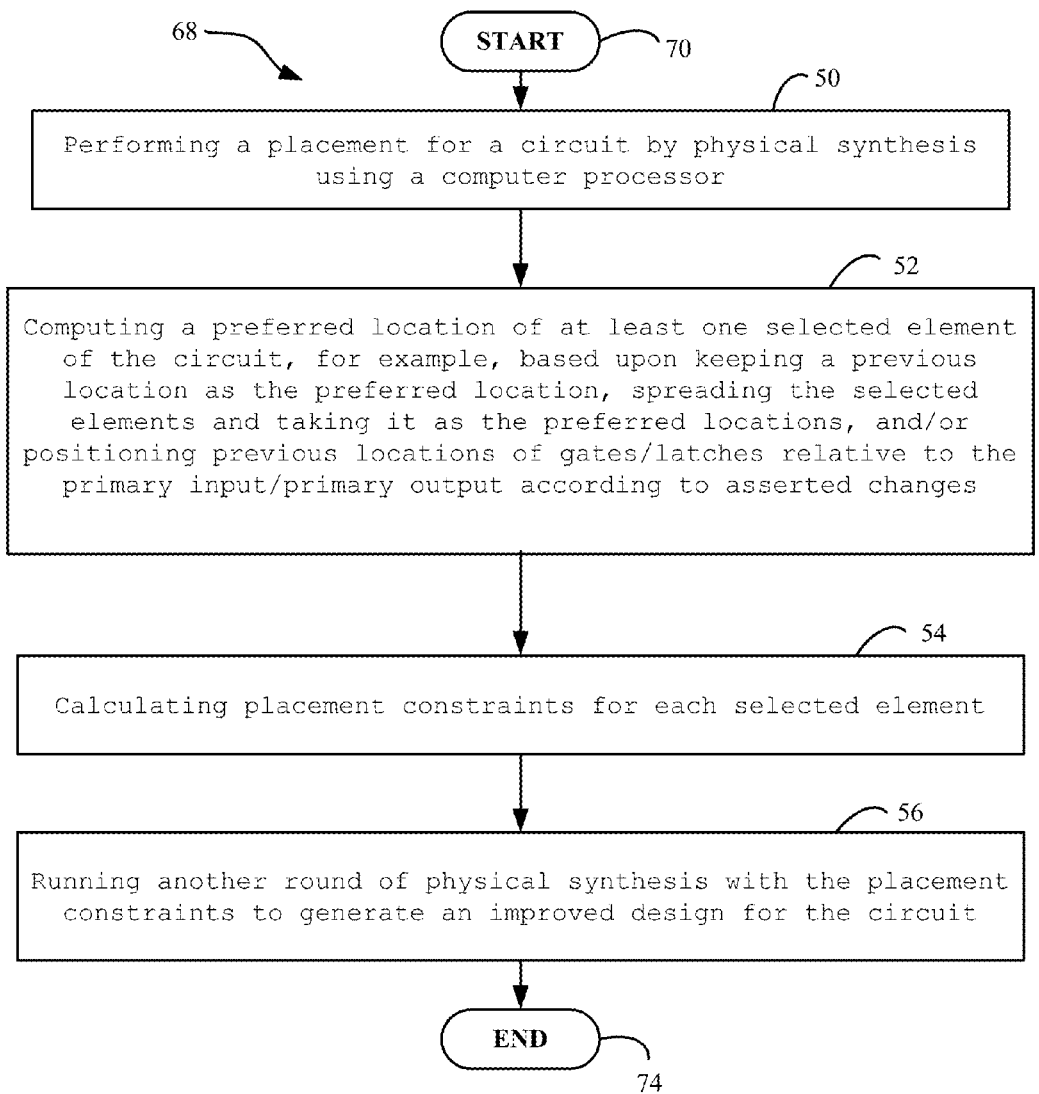
FIG. 4 is a flowchart illustrating method aspects according to the method of FIG. 2.

In another method embodiment, which is now described with reference to flowchart 68 of FIG. 4, the method begins at Block 70. The method may include the steps of FIG. 2 at Blocks 50, 52, 54, and 56. Furthermore, Block 52 may include, for example, computing the preferred location based upon keeping a previous location as the preferred location, spreading the selected elements and taking it as the preferred locations, and/or positioning previous locations of gates/latches relative to the primary input/primary output. The method ends at Block 74.

The spreading may be based upon the area of added logic and/or diffusion. The asserted changes may be based upon timing, congestion, and/or design rules.

Figure 5:
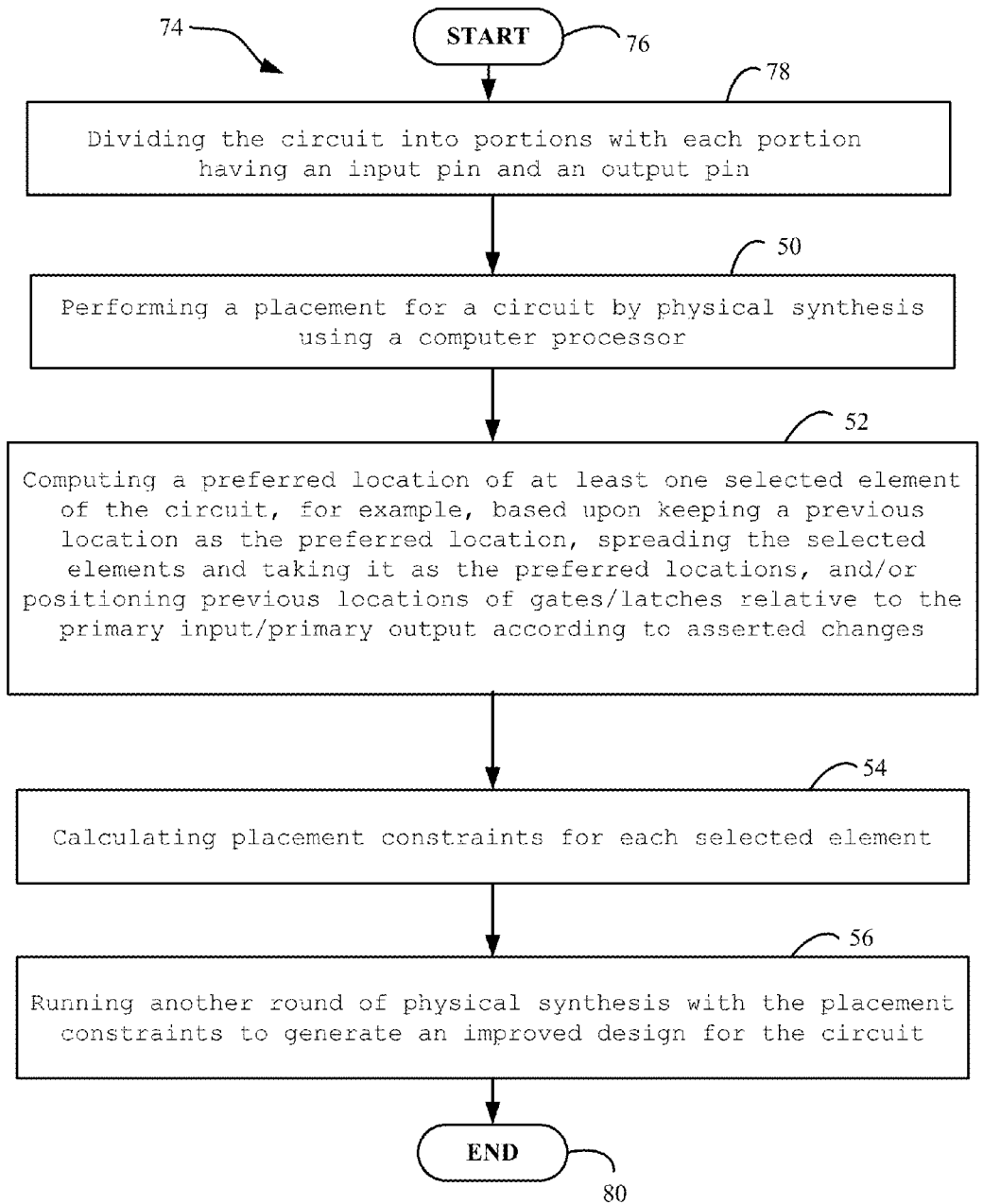
FIG. 5 is a flowchart illustrating method aspects according to the method of FIG. 4.

In another method embodiment, which is now described with reference to flowchart 74 of FIG. 5, the method begins at Block 76. The method may include the steps of FIG. 4 at Blocks 50, 52, 54, and 56. The method may also include dividing the circuit into portions with each portion having an input pin and an output pin at Block 78. The method ends at Block 80.

Figure 6:
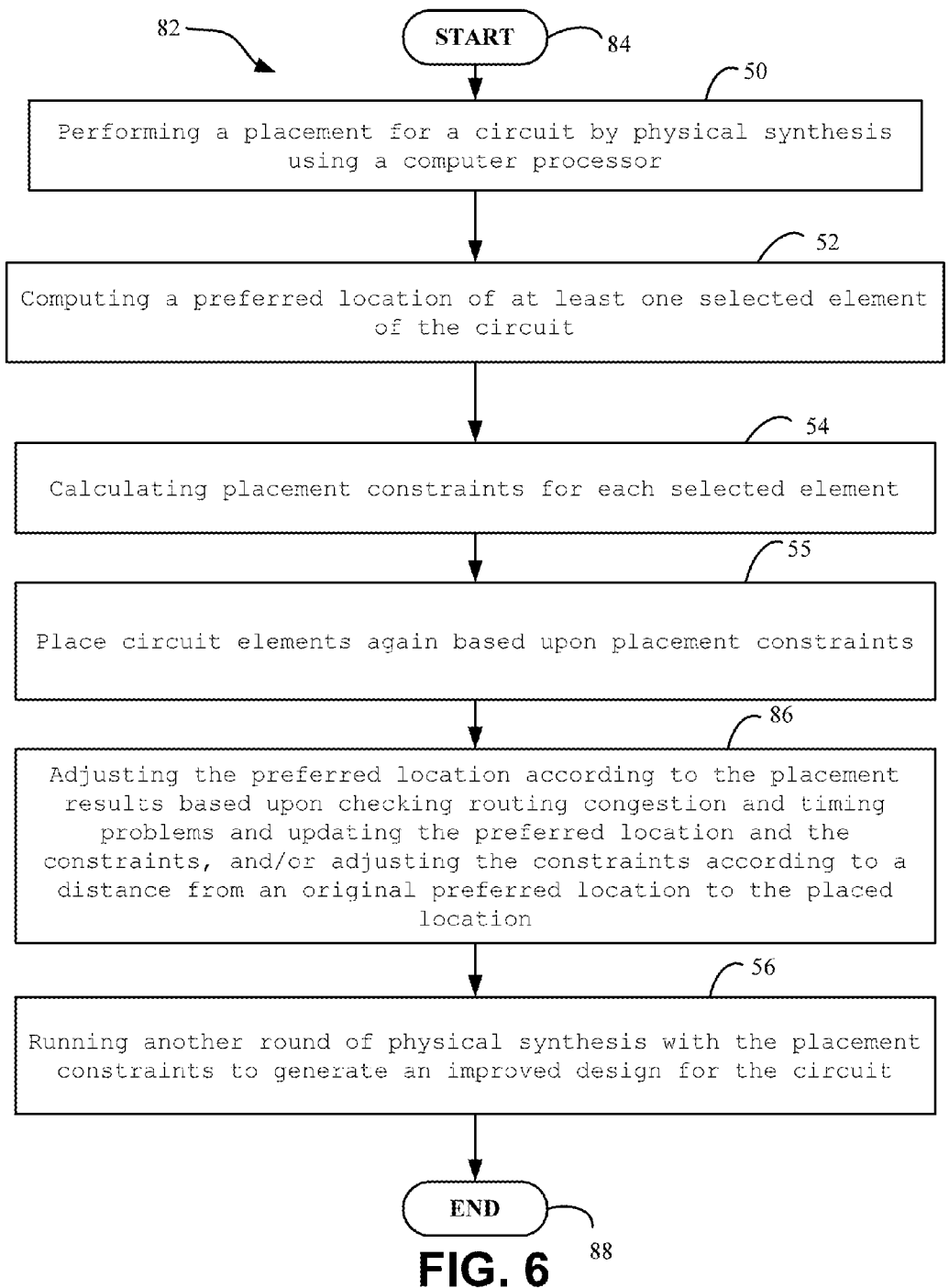
FIG. 6 is a flowchart illustrating method aspects according to the method of FIG. 4.

In another method embodiment, which is now described with reference to flowchart 82 of FIG. 6, the method begins at Block 84. The method may include the steps of FIG. 4 at Blocks 50, 52, 54, and 56. The method may also include placing the circuit elements again based upon placement constraints at Block 55. The method may further include adjusting the preferred location according to the placement results based upon checking routing congestion and timing problems and updating the preferred location and the constraints, and/or adjusting the constraints according to a distance from an original preferred location to the placed location. Further, if the distance is large an attraction force is reduced at Block 86. The method ends at Block 88.

Another aspect is computer readable program codes coupled to tangible media to improve a circuit design system 10. The computer readable program codes may be configured to cause the program to perform a placement 13 for a circuit 14 by physical synthesis using a computer processor 12. The computer readable program codes may also compute a preferred location 18 of at least one selected element 20 of the circuit 14. The computer readable program codes may further calculate placement 13 constraints for each selected element 20. The computer readable program codes may additionally perform another round of physical synthesis with the placement 13 constraints to generate an updated design for the circuit 14.

The computer readable program codes may also perform additional rounds of physical synthesis with updated placement 13 constraints until a convergence of desirable characteristics emerges based upon the timing, power, area, and/or operating temperature of the design. The computer readable program codes may further compute the preferred location 18 based upon keeping a previous location 26 as the preferred location, spreading the selected elements 20 and taking it as the preferred locations, and positioning previous locations of gates/latches 28 relative to the primary input 30 and/or primary output 32 according to asserted changes. The computer readable program codes may additionally divide the circuit 14 into portions 36 with each portion having an input pin 38 and an output pin 40. The computer readable program codes may also adjust the preferred location 18 according to the placement 13 results based upon checking routing congestion and/or timing problems and updating the preferred location and the constraints, and/or adjusting the constraints according to a distance from an original preferred location 44 to the placement 18.

In view of the foregoing, the system 10 provides an updated circuit design system. For design iterations, from register-transfer level to layout, a designer may perform physical synthesis, e.g. place, optimization, route, and/or the like, for many iterations. As a result there may be logic changes, small timing assertion changes, and/or the like.

However, such is different from engineering change orders ("ECO"). ECO is usually more strict, e.g. release instruction tape-A is not going to change. Also, ECO usually happens later in the flow.

A situation may arise after each design iteration where designers may observe huge change in synthesis results with the same set of parameters/settings. In addition, designers may have to tune the parameters/settings for the new design drop, which may result in long turnaround times and/or convergence failure.

System 10 may use two different concepts of iterations. The first concept includes iterations run between two physical synthesis runs, and it involves the iterations of placements. The iterations of physical synthesis are the background of this invention.

Figure 7:
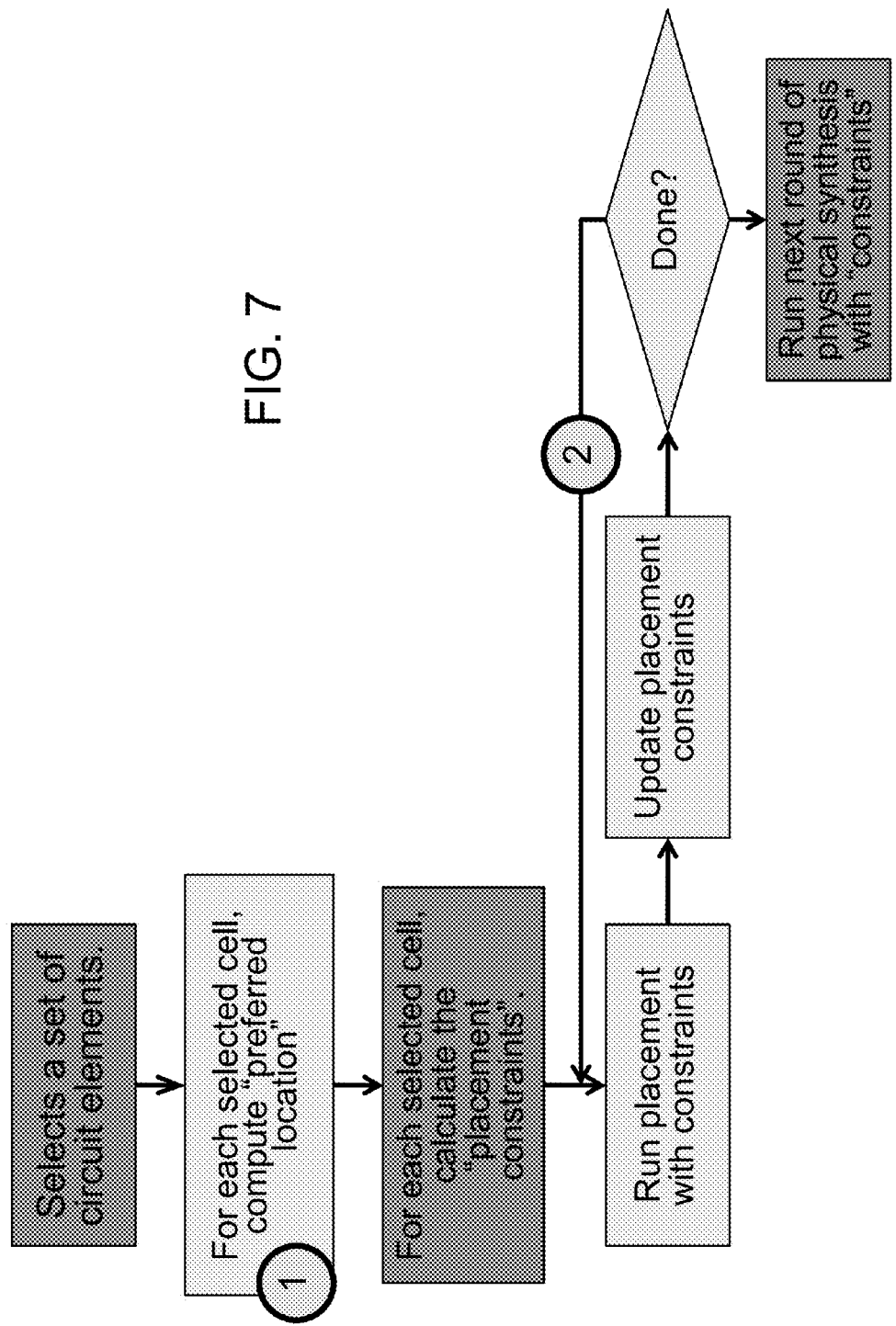
FIG. 7 is a flowchart illustrating method aspects according to various embodiments.

The second concept involves the iterations of physical synthesis, e.g. PS1, PS2, PS3, PS4 are the 4 iterations, and between the iterations, e.g. PS2 and PS3, the designers make changes to the design, e.g. timing requirement, add new logics, delete existing logics, and/or the like. If the results of PS3 is similar to (or better than) the results of PS2, then system 10 considers it as converging. Sometimes, PS3's results is much worse than PS2. With additional reference to FIG. 7, in which a flow chart illustrates the situation between 2 iterations, and the goal is to make PS3's results similar to (or better than) PS2 as much as possible.

In one embodiment, it may be too restrictive to use "previous locations" 26 so system 10 calculates "preferred locations" 18 to address logic changes, timing assertion changes, congestion, timing, design rules, and/or the like. The Block marked 1 involves a pre-synthesis calculation. And, the feedback loop marked 2 involves placement-driven 13 preferred locations/constraints 18 adjustment. In another embodiment, the adjustment is performed incrementally.

In one embodiment, the system 10 calculates the "preferred locations" 18 at the Block marked 1. In another embodiment, the system 10 adaptively adjusts the preferred locations 18 based on a new placement 13 during a subsequent iteration.

As a result, the system 10 keeps the quality of results of any desired subset of the circuit similar to a selected previous physical synthesis run. Also, the system 10 enables balance between design stability and further optimization due to logic/timing-assertion changes. Further, the system 10 controls divergence throughout design iterations. In addition, the system 10 greatly reduces the time to retune the parameters/setting of a given physical synthesis run. Still further, the system 10 may reduce the runtime of the physical synthesis process.

In one embodiment, the system 10 calculates the "preferred locations" 18 at the Block marked 1 using various methods. In another embodiment, the system 10 uses various methods to adjust "Preferred Locations" 18. For example, the system 10 runs the placement 13 during the next iteration, with the placement constraints set from the Block marked 1.

In embodiments, system 10 uses various methods to select the set of circuit 14 elements 20. For instance, system 10 can select the elements 20 based on one or more of the following methods.

In one embodiment, all latches 28, flip-flops, clocked elements, and/or the like or a subset of such.

System 10 may utilize the fact that latches 28 usually have the same name in very high speed integrated circuit hardware description language ("VHDL") or in Verilog, or other similar languages.

In another embodiment, system 10 selects gates and/or latches 28 in timing-closed paths. System 10 may keep the results of previously optimized timing paths in some cases.

In one embodiment, system 10 selects latches and/or gates 28 that are not affected by new timing assertions. System 10 may not re-optimize paths with same timing assertions as previous in some cases.

In another embodiment, system 10 selects first-level logics and/or latches 28 connected directly to primary input 30 and/or primary output 32. It is noted that the first-level paths are sometimes "troublesome". In another embodiment, a user specifies the gates/latches 28 to be selected.

In one embodiment, the system 10 uses various methods to create placement 13 constraints. For example, system 10 can create placement 13 constraints based on one or more of the following methods.

In one embodiment, system 10 uses block point attraction. In another embodiment, system 10 calculates a constant "force" for all the selected cells. In another embodiment, the force can be based on timing criticality, congestion, thermal profile, and/or the like.

In one embodiment, system 10 uses movebounds, e.g., modules. In another embodiment, system 10 uses same movebound size of all circuit 14 elements. In another embodiment, system 10 calculates movebound area based on the fanin/fanout of the selected gate/latch 28.

In one embodiment, system 10 uses group compile to create placement 13 constraints. In another embodiment, system 10 uses proximity constraints between groups of gates to create placement 13 constraints. In another embodiment, the proximity constraints are similar to attraction.

Figure 9:
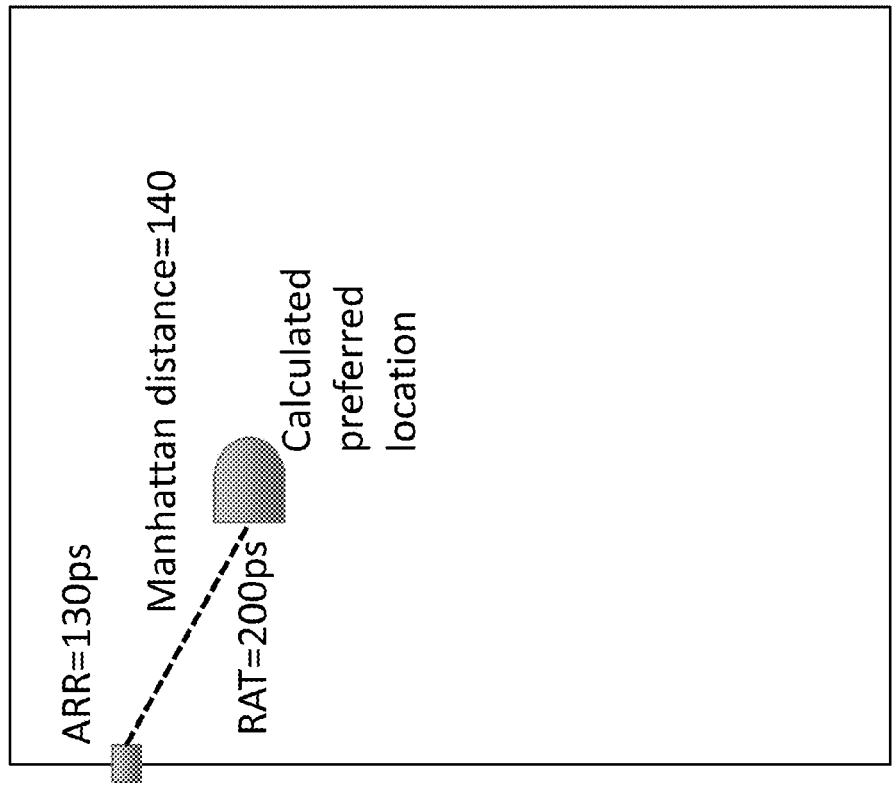
FIGS. 8 and 9 together illustrate the difference between a previous location and a calculated preferred location.
Figure 8:
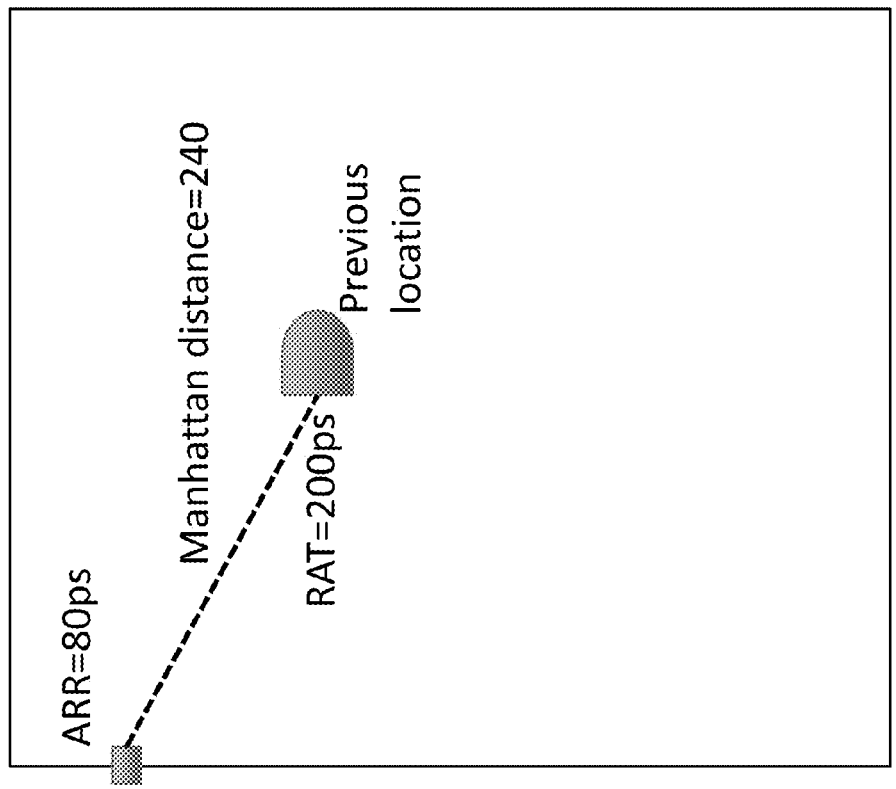

With additional reference to FIGS. 8 and 9, an example illustrates the difference between a previous location and a calculated preferred location. In one embodiment, FIG. 8 shows a first placement with an arrival time (ARR) of 80 picoseconds (ps) and a required arrival time (RAT) of 200 ps. FIG. 9 shows an updated circuit with a calculated preferred location using system 10. The updated circuit has an improved ARR of 130 ps and a RAT of 200 ps.

In one embodiment, one concept provided is to identify a subset of circuit 14 elements 20 and apply block point attractions with a calculated force to the location based on the layout from previous physical synthesis results (refers to "previous locations" 26). This is more flexible than fixing all the gates to the previous locations 26. If a subset of gates is removed from the previous design iterations, holes may be created and the placement 13 engine may find it difficult to insert other gates into the holes. This may provide better control than moving bounds because the selected gates 28 will be placed relatively closed to the previous locations 26.

In one embodiment, the system 10 selects a set of circuit 14 elements 20. The set of circuit 14 elements 20 can be all latches 28 (or flip-flops or clocked elements); or a subset of logic gates along the set of most critical paths.

For each selected cells, the system 10 records the placement 13 in the current layout after the previous physical synthesis run (A). For each selected cells, calculate the "force". System 10 may use a constant "force" for all the selected cells (B). Or the force can be based on timing criticality, congestion, thermal profile, and/or the like.

For each selected cells, system 10 sets up a block point attraction to the location from (A) using the calculated force from (B). The block point attraction is similar to the net weight between logic gates. However, it is a "net weight" between the point and the cell along a "virtual net".

It is noted that the design iterations discussed above can be commonly observed in hierarchical designs where modules are separately undergone iterations of physical synthesis and changes in floorplans/logic as well as timing contracts at the module boundaries.

Along iterations, we observed consecutive physical synthesis runs often return very different results, in terms of cell placement, critical timing paths, congestion hotspots, etc. Note that EDA vendor tools are traditionally not stable such that small change in inputs usually leads to significant difference in the results. Such instability would not cause problems because the new results, yet different, usually have no major degradation in solution quality. However, with design iterations, designers spend enormous time in order to tune the tool settings for most timing-critical paths. With all the tuning for the previous runs, it is very likely the synthesis tool would return suboptimal results if it is lack of design stability.

For example, after iterations of synthesis runs, the designer collected 1000 critical paths and tuned the tool to improve the timing on the set of paths. After logic changes, a rerun of synthesis tools with the exact same setting might result in substantially degraded timing because the logic changes can trigger a significant change in placement and the previous tuned settings over-constrains the new synthesis run. Instability between synthesis runs with well-tuned setting can be a tragedy for designers because it implies that the designers have to spend days to re-tune the tools before they can do the next iteration of design change. This greatly reduces the design productivity and is one of the results why circuit designs sometimes take months to close.

Placement stability between difference runs may be important. One approach is to focus on the specific stability problem of min-cut placers and the use of fake pins and fake nets. A more general method is needed because different synthesis tools use a variety of placement engines and settings. Another related technique is incremental placement, which tries to minimize displacement of cells during optimization. However, incremental placement does not solve the problem of design stability along iteration because it focuses on small changes due to timing optimization steps. Between design iterations, major logic changes are possible and a more flexible way to control design stability is required.

Note that stable synthesis is a totally different concept than re-synthesis due to Engineering Change Order (ECO). ECO usually happens late in the design flow and it may require that most logic being fixed in placement. During ECO processes, only a tiny part of logic may get touched and incremental placement is usually invoked to handle the placement change. For stable synthesis, it may be detrimental to fix the placement of most gates between iterations because over-constraining the synthesis tools usually leads to poor results. More importantly, major changes between design iterations might limit designers to preplace most cells when many gates are being removed from or added to the netlist.

System 10 may provide an effective technique to consider stability in any synthesis tool between design iterations with design changes. The stability is enabled by special controls to the placement engine. Experimental results showed that system 10 greatly improves the stability between consecutive synthesis iterations. More importantly, stable synthesis results are better than a synthesis rerun without stability consideration.

As will be appreciated by one skilled in the art, aspects may be embodied as a system, method, and/or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the embodiments are described above with reference to flowchart illustrations and/or block diagrams of methods, apparatus (systems) and computer program products according to the embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:
1. A circuit design system comprising:
 a computer processor to perform a placement for a circuit by physical synthesis;
 a controller to compute a preferred location of at least one selected element of the circuit, the preferred location is computed based on a calculated attraction force, the attraction force decreases as a distance between the selected element's preferred location and a location in a previous physical synthesis result increases, and to calculate placement constraints for each selected element; and an updated design for the circuit generated by performing another round of physical synthesis with the placement constraints.

2. The system of claim 1 further comprising a converger to detect a threshold of desirable characteristics based upon performing additional rounds of physical synthesis with updated placement constraints until a convergence emerges based upon at least one of timing, power, area, and operating temperature of the design.

3. The system of claim 1 further comprising a locator to compute the preferred location based upon at least one of keeping a previous location as the preferred location, spreading the selected elements to new locations and using the new locations as the preferred locations, and positioning previous locations of gates relative to a primary input and primary output according to asserted changes.

4. The system of claim 3 wherein the spreading is based upon at least one of area of added logic and diffusion.

5. The system of claim 3 wherein the asserted changes are based upon at least one of timing, congestion, and design rules.

6. The system of claim 3 further comprising portions of the circuit with each portion having an input pin and an output pin.

7. The system of claim 1 further comprising an adjustor to adjust the preferred location according to the placement results based upon at least one of analyzing routing congestion and timing problems and updating the preferred location and the constraints, and adjusting the constraints according to a distance from an original preferred location to the placement.

8. A method comprising:
performing a placement for a circuit by physical synthesis using a computer processor;
computing a preferred location of at least one selected element of the circuit, the preferred location is computed based on a calculated attraction force, the attraction force decreases as a distance between the selected element's preferred location and a location in a previous physical synthesis result increases;
calculating placement constraints for each selected element; and
performing another round of physical synthesis with the placement constraints to generate an updated design for the circuit.

9. The method of claim 8 further comprising performing additional rounds of physical synthesis with updated placement constraints until a convergence of desirable characteristics emerges based upon at least one of timing, power, area, and operating temperature of the design.

10. The method of claim 8 further comprising computing the preferred location based upon at least one of keeping a previous location as the preferred location, spreading the selected elements to new locations and using the new locations as the preferred locations, and positioning previous locations of gates/latches relative to a primary input/primary output according to asserted changes.

11. The method of claim 10 wherein the spreading is based upon at least one of area of added logic and diffusion.

12. The method of claim 10 wherein the asserted changes are based upon at least one of timing, congestion, and design rules.

13. The method of claim 10 further comprising dividing the circuit up into portions with each portion having an input pin and an output pin.

14. The method of claim 8 further comprising adjusting the preferred location according to the placement results based upon at least one of analyzing routing congestion and timing problems and updating the preferred location and the constraints, and adjusting the constraints according to a distance from an original preferred location to the placement.

15. A computer program product embodied in a non-transitory computer-readable medium comprising:
computer readable program codes coupled to the non-transitory computer-readable medium to improve a circuit's design, the computer readable program codes configured to cause the program to:
perform a placement for a circuit by physical synthesis using a computer processor;
compute a preferred location of at least one selected element of the circuit, the preferred location is computed based on a calculated attraction force, the attraction force decreases as a distance between the selected element's preferred location and a location in a previous physical synthesis result increases;
calculate placement constraints for each selected element; and
perform another round of physical synthesis with the placement constraints to generate an updated design for the circuit.

16. The computer program product of claim 15 further comprising program code configured to: perform additional rounds of physical synthesis with updated placement constraints until a convergence of desirable characteristics emerges based upon at least one of timing, power, area, and operating temperature of the design.

17. The computer program product of claim 15 further comprising program code configured to: compute the preferred location based upon at least one of keeping a previous location as the preferred location, spreading the selected elements to new locations and using the new locations as the preferred locations, and positioning previous locations of gates/latches relative to a primary input/primary output according to asserted changes.

18. The computer program product of claim 17 further comprising program code configured to: divide the circuit into portions with each portion having an input pin and an output pin.

19. The computer program product of claim 15 further comprising program code configured to: adjust the preferred location according to the placement results based upon at least one of analyzing routing congestion and timing problems and updating the preferred location and the constraints, and adjusting the constraints according to a distance from an original preferred location to the placement.

* * * * *